(12) United States Patent
Vickes et al.

(10) Patent No.: US 7,724,091 B2
(45) Date of Patent: May 25, 2010

(54) MATRIX BALUN

(75) Inventors: Hans-Olof Vickes, Särö (SE); Mattias Ferndahl, Göteborg (SE)

(73) Assignee: SAAB AB, Linköping (SE)

( * ) Notice: Subject to any disclaimer, the term of this patent is extended or adjusted under 35 U.S.C. 154(b) by 0 days.

(21) Appl. No.: 12/251,622

(22) Filed: Oct. 15, 2008

(65) Prior Publication Data

US 2009/0102574 A1    Apr. 23, 2009

(30) Foreign Application Priority Data

Oct. 15, 2007    (EP)    ................................ 07118507

(51) Int. Cl.
*H03F 3/60*    (2006.01)
(52) U.S. Cl. ........................................ 330/286; 330/54
(58) Field of Classification Search ................ 330/286, 330/295, 124 R, 54
See application file for complete search history.

(56) References Cited

U.S. PATENT DOCUMENTS

| 4,712,024 | A | | 12/1987 | McGuire et al. |
|---|---|---|---|---|
| 4,752,746 | A | | 6/1988 | Niclas |
| 4,916,410 | A | | 4/1990 | Littlefield |
| 5,021,743 | A | * | 6/1991 | Chu et al. ........................ 330/54 |
| 5,485,118 | A | | 1/1996 | Chick |
| 6,472,941 | B2 | * | 10/2002 | Shigematsu .................. 330/286 |
| 6,597,243 | B1 | * | 7/2003 | Fratti ........................... 330/54 |
| 6,768,380 | B2 | * | 7/2004 | Hong et al. .................. 330/286 |
| 6,778,015 | B2 | * | 8/2004 | Ogawa ........................ 330/286 |

FOREIGN PATENT DOCUMENTS

EP        0 430 508        6/1991

OTHER PUBLICATIONS

European search report—May 19, 2008.

* cited by examiner

*Primary Examiner*—Henry K Choe
(74) *Attorney, Agent, or Firm*—Venable LLP; Eric J. Franklin

(57) ABSTRACT

An active input matrix balun and a method for the same. The matrix balun has one input transmission line with an RF-in terminal for receiving a single ended RF-in signal and a first output transmission line with a first RF-out terminal and an adjacent second output transmission line with a second RF-out terminal. Two balanced RF-out signals at the first and at the second RF-out terminal, where each RF-out signal has an amplitude level equal to or exceeding the amplitude level of the RF-in signal and where the RF-out signals have a mutual phase difference of 180° and are of equal amplitude levels.

22 Claims, 5 Drawing Sheets

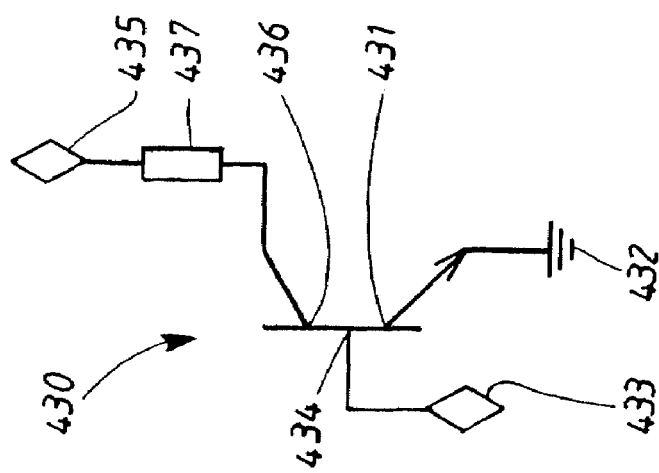
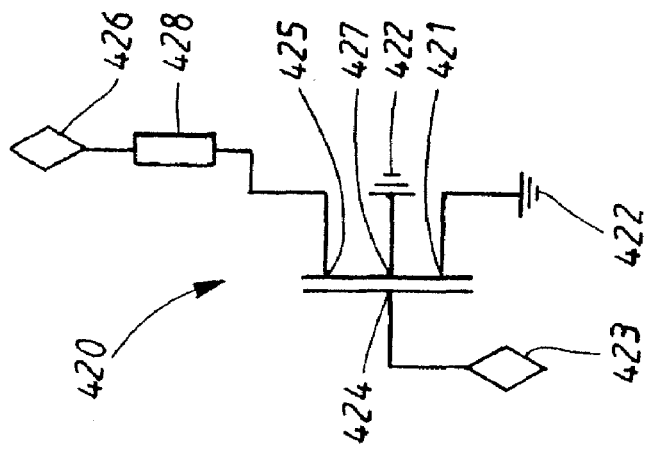
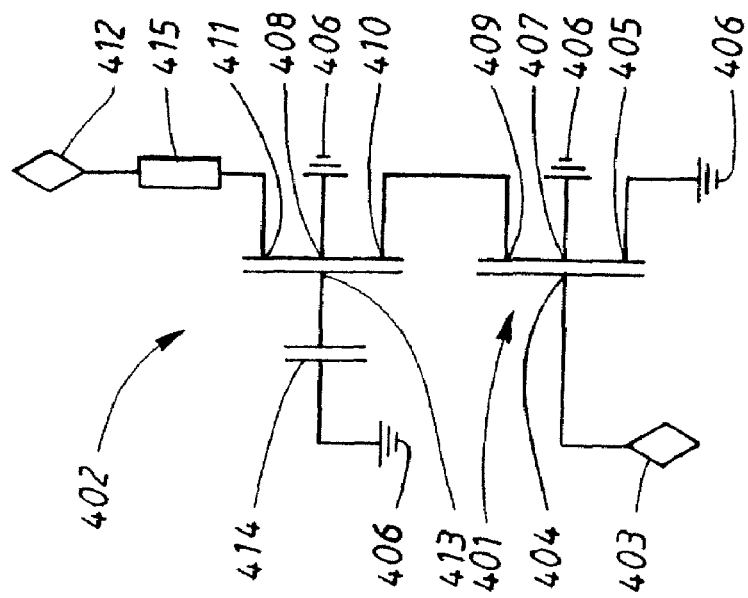
FIG.4c
FIG.4b
FIG.4a

MATRIX BALUN

CROSS-REFERENCE TO RELATED APPLICATIONS

This application claims priority to European patent application 07118507.8 filed 15 Oct. 2007.

TECHNICAL FIELD

The invention relates to the field of active baluns providing a balanced signal from a single ended or unbalanced signal.

BACKGROUND ART

Baluns are used to connect an unbalanced (asymmetrical) circuit to a balanced (symmetrical) circuit. A balun can e.g. be used between a coaxial cable, being an unbalanced circuit, and a ribbon cable being a balanced circuit. Baluns are widely used in e.g. radar systems and communication systems such as wireless communication systems.

An input balun having a single, unbalanced input signal ideally produces two output signals with equal magnitude but with a phase difference of 180°. An output balun combines two input signals with a 180° phase difference to produce a single output signal.

A wire-wound transformer is a simple type of a passive balun. The unbalanced connection is made at one winding and the balanced connection at a second winding. These kinds of baluns are relative expensive, produce losses and are narrow banded.

Another passive type of balun is the LC-lumped balun shown in FIG. 1. This is the first order lattice balun very commonly used but it is very limited in bandwidth and will have an insertion loss exceeding more than 3 dB. The lumped balun has an input terminal 101, output terminals 102 and 103 and a ground connection 104. The input terminal is connected to the output terminal 102 through a first capacitor 105 and to output terminal 103 through first inductor 108. This means that there will be a phase difference between the output terminals of 180° and by choosing suitable values of the first capacitor 105 and the first inductor 108 the signals at the output terminals 102 and 103 will have the same amplitude. The output terminal 103 will be connected to the ground through a second capacitor 106 and the output terminal 102 will be connected to the ground 104 through a second inductor 107. This has the effect that the two output terminals will be balanced in relation to the ground.

There are also active baluns involving active components like transistors. One example of such an active balun is described in U.S. Pat. No. 4,994,755. FIG. 2 shows the principle of this active input balun 200. DC biasing components, DC blocking capacitors and output transmission line sections are not shown in the figure for clarity reasons. An input transmission line 201 comprises transmission line sections 201a-201c which are successively coupled to inputs 202a-202c of amplifiers 203a-203c. The amplifiers can e.g. comprise FET transistors. The outputs, 204a-204c, of the amplifiers 203a-203c are also successively coupled to an output transmission line 205 comprising series coupled transmission line sections 206a-206b via transmission line sections 207a-207c as shown in FIG. 2. An RF (Radio Frequency) signal is fed at input terminal 208 and propagates through the input transmission line 201, with portions of said signal being coupled to the amplifiers 203a-203c. At the end of the input transmission line 201 the remaining portion of the RF signal is coupled to a first output terminal 209. The gain provided by each of the amplifiers to the signal portions coupled through them are selected such that at a second output terminal 210, the signal portions through the amplifiers are added in phase with the 180° phase shift provided by the transistor elements in the amplifiers 203. The gain of the amplifiers are adjusted such that the amplitude of the output signal at the second terminal 210 is substantially the same as at the first output terminal 209. The gain of the amplifiers can be adjusted to compensate for some of the transmission losses. However the RF output level at the first output terminal 209 must be lower then the RF amplitude at the input terminal 208 as there is no gain in the input transmission line. In order to get amplitude balance at the output terminals the amplitude of the RF signal at the second output terminal 210 also has to be below the amplitude level at the input terminal. By using the distributed/travelling wave principle where the input RF-signal is successively propagated to a second transmission line through a distributed capacitance this solution has a relatively broad bandwidth. A severe drawback is however that the amplitude level of each balanced RF output signal, henceforth called the RF-out signal, has to be below the amplitude level of the RF input signal, henceforth called the RF-in signal, in order to obtain amplitude balance between the output signals.

Thus there is a need to provide a balun having an improved bandwidth in combination with providing RF-out signals with good amplitude balance and a mutual phase difference of 180° and with amplitude levels at the output terminals equal to or exceeding the signal level at the input terminal.

SUMMARY OF THE INVENTION

The object of the invention is to provide a matrix balun and a method for adjusting the matrix balun, the matrix balun having m columns and n transmission lines in a matrix comprising an input transmission line $T_1$ with an RF-in terminal for receiving a single-ended RF-in signal, the RF-in terminal being connected to one end of the input transmission line $T_1$, and a first output transmission line $T_{n-1}$, with a first RF-out terminal being connected to one end of the first output transmission line $T_{n-1}$ to solve the problem to achieve an improved bandwidth in combination with providing RF-out signals with good amplitude balance and a mutual phase difference of 180° and with amplitude levels at the output terminals equal to or exceeding the signal level at the input terminal. The input transmission line $T_1$ has portions of the RF-in signal successively tapped to the first output transmission line $T_{n-1}$ via one amplifier $A_{1,c}$ or at least two amplifiers $A_{1,c}$ arranged in parallel in one row, the amplifiers having an input terminal connected to the input transmission line $T_1$ and having a certain gain.

This object is achieved by providing a matrix balun wherein the input transmission line $T_1$ is directly or indirectly coupled to the first output transmission line $T_{n-1}$. The matrix balun further comprises a second output transmission line $T_n$ adjacent the first output transmission line $T_{n-1}$. The second output transmission line $T_n$ has a second RF-out terminal connected to one end of the second output transmission line $T_n$, making a total of n transmission lines, $T_1$ to $T_n$ arranged in consecutive order after increasing value of n. The amplified portions of the RF-in signal flowing in the first output transmission line $T_{n-1}$ are successively tapped from the first output transmission line $T_{n-1}$ directly to the second output transmission line $T_n$ via one additional amplifier or at least two additional amplifiers arranged in parallel in a row, thus obtaining two balanced RF-out signals at the first and at the second RF-out terminal. Each RF-out signal has an amplitude level equal to or exceeding the amplitude level of the RF-in signal and the RF-out signals have a mutual phase difference of 180° and are of equal amplitude levels.

The object is further achieved by a method of adjusting the matrix balun wherein the amplitude level of two RF-out signals are balanced by varying gain of amplifiers $A_{k,c}$, impedance of open stubs $O_{n,1}$ to $O_{n,m}$ and $O_{n-1,1}$ to $O_{n-1,m}$, the impedances of line transmission sections $T_{i,j}$ and line transmission sections $TA_{k,c}$ included in amplifiers $A_{k,c}$. The phase difference between the two RF-out signals is adjusted by varying the impedances of the line transmission sections $T_{i,j}$ and the line transmission sections $TA_{k,c}$ included in the amplifiers $A_{k,c}$ and the impedance of open stubs $O_{n,1}$ to $O_{n,m}$ and $O_{n-1,1}$ to $O_{n-1,m}$ to keep the difference at substantially 180°.

The main advantage with the inventive matrix balun is an improved bandwidth while at the same time achieving RF-out signals with a good amplitude balance and a mutual phase difference of 180° in combination with an amplitude level at the output terminals equal to or exceeding the signal level at the input terminal.

The output impedance of the matrix balun is adjustable by changing the characteristics of $T_{i,j}$, $A_{c,k}$ and $O_{n,m}$.

Further advantages are achieved by implementing one or several of the features of the independent claims which will be explained below.

BRIEF DESCRIPTION OF THE DRAWINGS

FIGS. 4a, 4b, and 4c Schematically show three embodiments of amplifiers.

DETAILED DESCRIPTION

The invention will now be described in detail with reference to the drawings.

Figure 1:
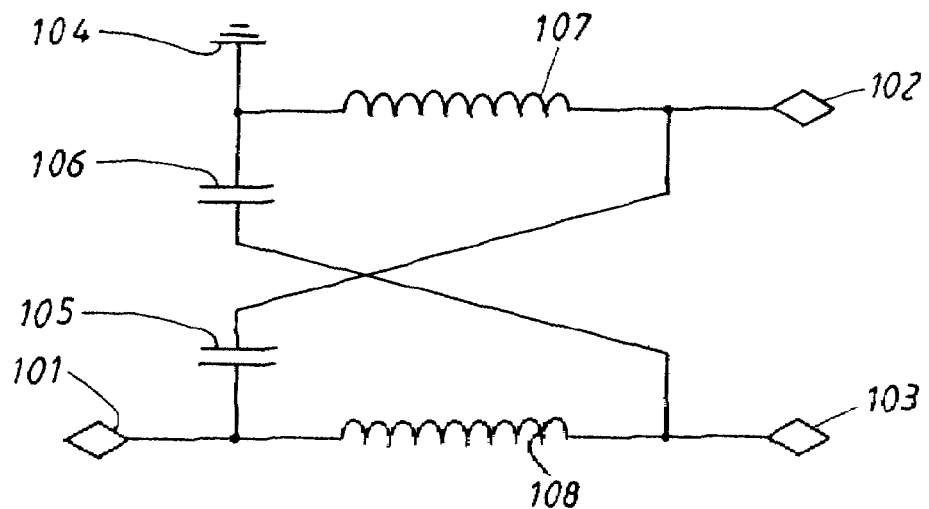
FIG. 1 Schematically shows a LC-lumped balun according to background art.
Figure 2:
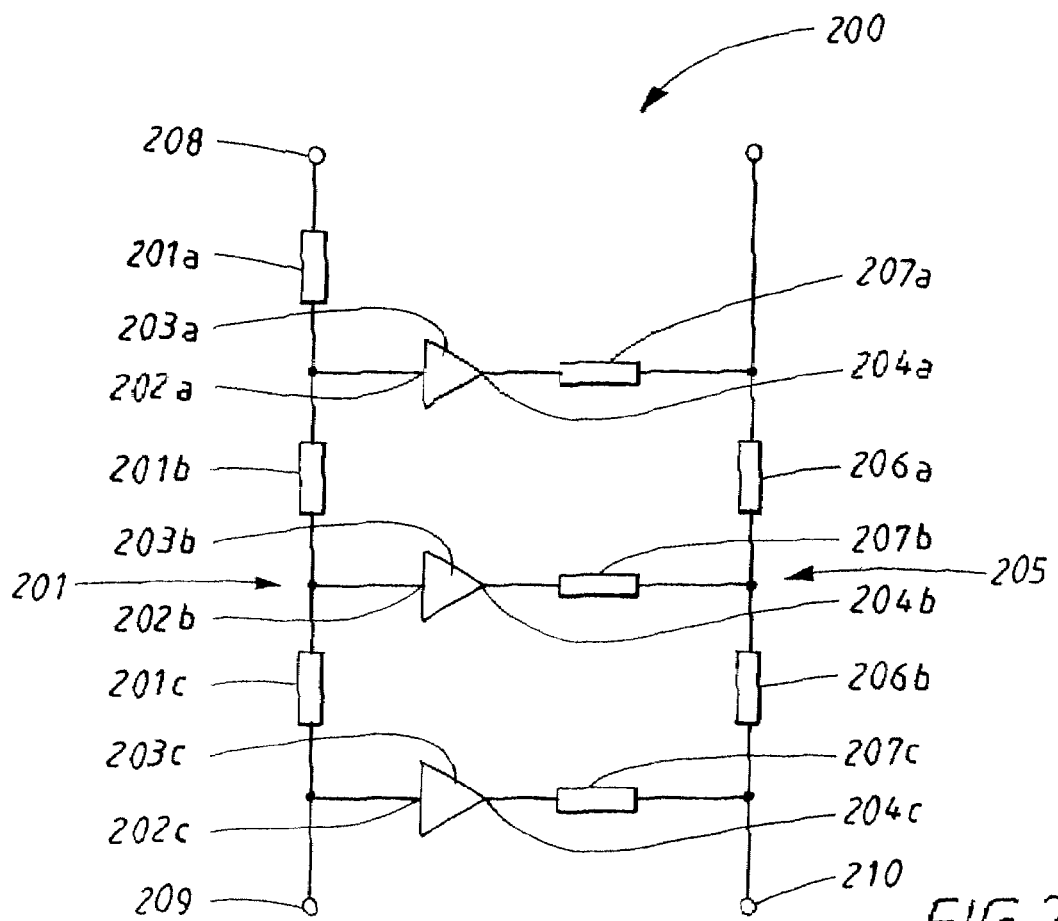
FIG. 2 Schematically shows an active input balun according to background art.

FIGS. 1 and 2 have already been described in relation with background art above.

Figure 3A:
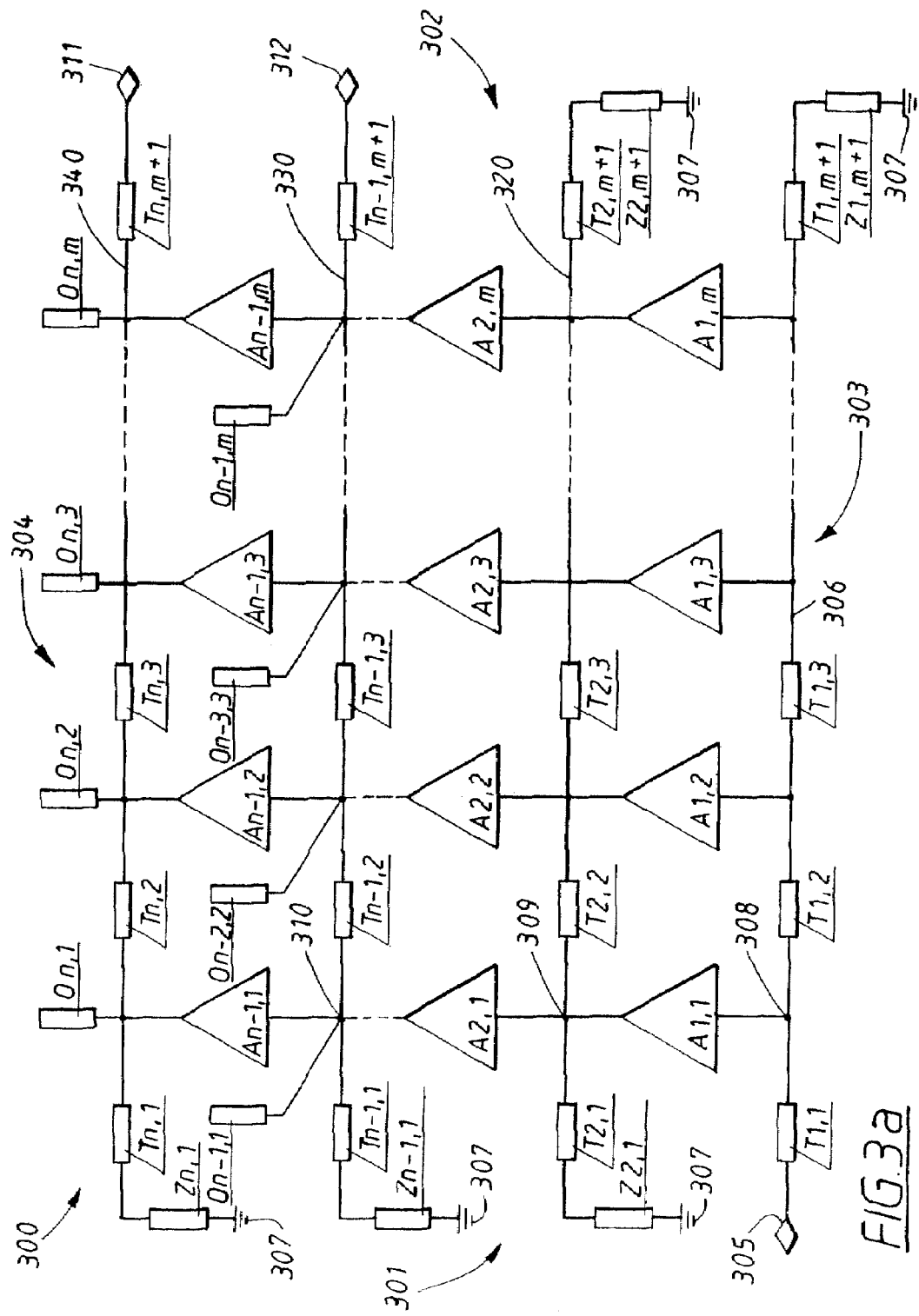
FIG. 3a Schematically shows an active input matrix balun according to the invention.

FIG. 3a schematically shows the layout of an active input matrix balun 300, henceforth called a matrix balun. The matrix consists of n transmission lines and m columns and has a first end 301, a second end 302, a bottom end 303 and a top end 304. Each transmission line consists of m+1 line transmission sections coupled in series. The matrix has an input transmission line $T_1$, 306, and a first output transmission line $T_{n-1}$, 330, with a first RF-out terminal 312 adjacent to a second output transmission line $T_n$, 340, with a second RF-out terminal 311. The second output transmission line is located at one end of the matrix. Each transmission line 306, 320, 330, 340 has m+1 line transmission sections $T_{i,j}$ coupled in series as will be further explained below.

The transmission lines extend between a first end 301 of the matrix and a second end 302 of the matrix. The columns extend between a bottom end 303 of the matrix and a top end 304 of the matrix. In the matrix balun configuration shown in FIG. 3a, the input transmission line $T_1$, 306, is at the bottom end 303 of the matrix and the second output transmission line $T_n$, 340, at the top end 304 of the matrix. In other embodiments the input transmission line $T_1$, 306, can be at the top end 304 of the matrix balun and the second output transmission line $T_n$, 340, at the bottom end 303 of the matrix balun. In the matrix balun configuration shown in FIG. 3a the RF-out terminals are located at the second end 302 of the matrix balun, but in other configurations they can be located at the first end 301 of the matrix balun.

A single ended (unbalanced) RF-signal is applied to an RF-in terminal 305 located at one end of the input transmission line $T_1$, 306. A line transmission section $T_{1,m+1}$ is connected to the other end of the input transmission line and the other end of the line transmission section $T_{1,m+1}$ is connected to a ground 307 via a termination impedance $Z_{1,m+1}$. In the example of FIG. 3a the RF-in terminal 305 is located at the first end of the matrix. In other embodiments the RF-in terminal 305 can be located at the second end of the matrix.

Figure 3B:
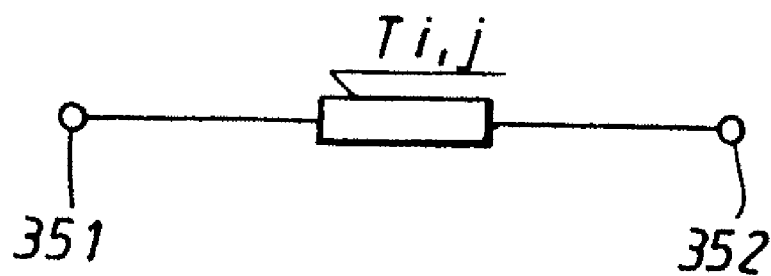
FIG. 3b Schematically shows a line transmission section.

Each line transmission section $T_{i,j}$ has a certain length and width which affects the impedance and time delay of each $T_{i,j}$. The index i denotes the number of the transmission line where $T_{i,j}$ is located and thus can assume values from 1 to n. The second index j can assume a value from 1 to m+1 where the value 1 represents a line transmission section at that end of the matrix including the RF-in terminal 305 and the value m+1 represents a line transmission section at the opposite end of the matrix. The index j also represents the column to which the line transmission section belongs with the exception that the line transmission section $T_{i,m+1}$ of each transmission lines does not belong to a certain column. For practical reasons the lengths of the line transmission sections are normally the same and the impedance is changed by varying the width of the line transmission sections. However the impedance can also be changed by varying the length of the line transmission section. Each line transmission section $T_{i,j}$ has an input end 351 at the end towards the end of the matrix including the RF-in terminal 305 and an output end 352 at the opposite end, see FIG. 3b.

Figure 3C:
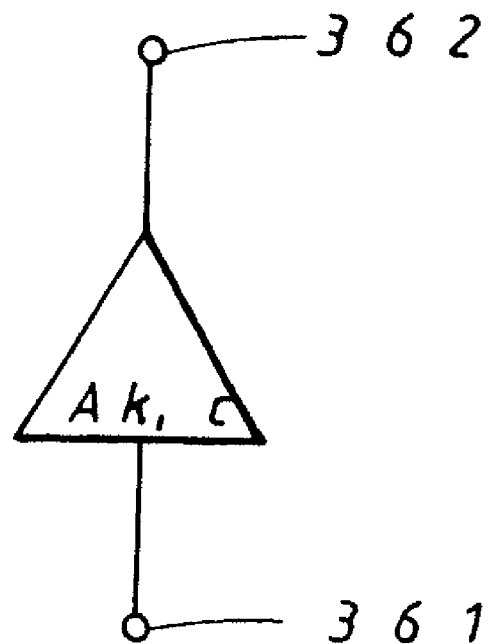
FIG. 3c Schematically shows an amplifier.

Column 1 is located towards the end of the matrix including the RF-in terminal 305 and column m at the opposite end of the matrix, In the matrix embodiment of FIG. 3a column 1 is located towards the first end 301 of the matrix and column m towards the second end 302 of the matrix. Amplifiers $A_{k,c}$, are arranged in parallel in n−1 rows and m columns and each have an input terminal 361 and an output terminal 362, see FIG. 3c. In an embodiment a row of amplifiers can comprise of only one amplifier $A_{k,c}$. The output ends 352 of each line transmission section in a transmission line, except for the output ends from the last line transmission section in each transmission line and the output ends from the line transmission sections located in the second output transmission line are coupled to input terminals 361 of m amplifiers $A_{k,c}$, the output terminals 362 of which are successively coupled to output ends 352 of m line transmission sections coupled in series and included in the next transmission line 320, 330, 340 in the matrix in the direction towards the second output transmission line $T_n$, 340. In $A_{k,c}$ the index k denotes the number of the row where the amplifier is located and the number of the transmission line to which the input terminal 361 of the amplifier is connected, with row 1 adjacent to the input transmission line $T_1$, 306, and the index c denotes the column number where the amplifier is located. Row number 1 is the row closest to the input transmission line $T_1$, 306. In The configuration of FIG. 3a row number 1 is at the bottom end 303 of the matrix and row n−1 at the top end 304 of the matrix. Each column c consists of corresponding line transmission sections for each transmission line, i.e. line transmission sections $T_{i,j}$ with j=c (T1,c, T2,c . . . Tn,c,) and amplifiers $A_{k,c}$ having the same c number (c=j).

As an example consider a matrix balun with 3 transmission lines and 4 columns. This means n=3 and m=4. The RF-in terminal in this example is located at the first end 301 of the matrix and towards the bottom side of the matrix. The first transmission line has line transmission sections $T_{1,1}$-$T_{1,5}$, the second transmission line has line transmission sections $T_{2,1}$-$T_{2,5}$ and the third transmission line has line transmission sections $T_{3,1}$-$T_{3,5}$. The input terminal of amplifier $A_{1,1}$ is connected to the output end of line transmission section $T_{1,1}$ in a first point 308 and the output terminal of amplifier $A_{2,1}$ is connected to the output end of line transmission section $T_{2,1}$ in the second transmission line in a second point 309. The input terminal of amplifier $A_{2,1}$ is connected to the output end of line transmission section $T_{2,1}$ in the second point 309 and the output terminal of amplifier $A_{2,1}$ is connected to the output end of line transmission section $T_{3,1}$ at a third point 310. The first column of the matrix comprises line transmission sections $T_{1,1}$, $T_{2,1}$ and $T_{3,1}$ and also amplifiers $A_{1,1}$ and $A_{2,1}$.

The active input matrix balun will have at least three transmission lines, i.e. $n \geq 3$. The first output transmission line $T_{n-1}$, 330, will consist of line transmission sections $T_{n-1,1}$ to $T_{n-1,m+1}$ coupled in series and the second output transmission line $T_n$, 340, will consist of line transmission sections $T_{n,1}$ to $T_{n,m+1}$ coupled in series. A first RF-out terminal 312 is connected to one end of the first output transmission line $T_{n-1}$, 330, and a second RF-out terminal 311 is connected to one end of the adjacent second output transmission line $T_n$, 340.

Each end of a transmission line not connected to an RF-in or RF-out terminal is connected to a termination impedance $Z_{u,v}$. Index u can have values from 1 to n, where u also denotes the number of the transmission line to which $Z_{u,v}$ is connected. The second index v can assume either value 1 denoting that $Z_{u,v}$ is terminating a transmission line at the end of the matrix including the RF-in terminal or value m+1, denoting that $Z_{u,v}$ is terminating a transmission line at the opposite end of the matrix. One end of $Z_{u,v}$ is connected to the ground, 307.

One open stub $O_{n,1}$ to $O_{n,m}$ is connected between each pair of line transmission sections $T_{n,1}/T_{n,2}$ to $T_{n,m}/T_{n,m+1}$ in the second output transmission line $T_n$, 340. The open stubs $O_{n,1}$ to $O_{n,m}$ are connected to the second output transmission line $T_n$, 340, at one end and open at the opposite end. $O_{n,1}$ is connected between $T_n$ and $T_{n,2}$ and $O_{n,2}$ between $T_{n,2}$ and $T_{n,3}$ and so on as shown in FIG. 3a. The stubs add an impedance being mainly capacitive at each point to which it is connected. The impedance of each stub is adjusted by varying the length and width of the stub. By adjusting these impedances the time delays and hence the phase and the level of the RF-out signal in the second output transmission line $T_n$, 340, can be adjusted. The necessary length of some stubs can be close to zero and can therefore be omitted. Open stubs $O_{n-1,1}$ to $O_{n-1,m}$ can also optionally be placed at the first output transmission line $T_{n-1}$ 330 between each pair of line transmission sections $T_{n-1,1}/T_{n-1,2}$ to $T_{n-1,m}/T_{n-1,m+1}$ in the same manner. These open stubs $O_{n-1,1}$ to $O_{n-1,m}$ are connected to the second output transmission line $T_{n-1}$, 330, at one end and open at the opposite end.

By arranging the amplifiers as described above, a distributed amplification of the RF-signal is accomplished. The distributed amplification has the advantage of being very broad banded and a bandwidth of at least one decade can be achieved. With the described configuration, portions of the RF-in signal are successively tapped to the first output transmission line $T_{n-1}$ 330 via one amplifier $A_{1,c}$ or at least two amplifiers $A_{1,c}$ arranged in parallel in one row. The amplifiers have an input terminal 361 connected to the input transmission line $T_1$, 306, and have a certain gain. The input transmission line $T_1$, 306, is directly or indirectly coupled to the first output transmission line $T_{n-1}$, 330. The matrix balun further comprises a second output transmission line $T_n$, 340, adjacent to the first output transmission line $T_{n-1}$, 330, the second output transmission line $T_n$, 340, having a second RF-out terminal 311 connected to one end of the second output transmission line $T_n$, 340, making a total of n transmission lines, $T_1$ to $T_n$ arranged in consecutive order after increasing value of n. The amplified portions of the RF-in signal flowing in the first output transmission line $T_{n-1}$, 330, are successively tapped from the first output transmission line $T_{n-1}$, 330, directly to the second output transmission line $T_n$, 340, via one additional amplifier or at least two additional amplifiers arranged in parallel in a row. In this way two balanced RF-out signals are obtained at the first, 312, and the second, 311, RF-out terminal, where each RF-out signal has an amplitude level equal to or exceeding the amplitude level of the RF-in signal and where the RF-out signals have a mutual phase difference of 180° and are of equal amplitude levels.

As mentioned above the first RF-out terminal 312 is located at one end of the first output transmission line $T_{n-1}$, 330, and the second RF-out terminal 311 is located and one end of the second output transmission line $T_n$, 340. The RF-out terminals are normally located at the ends of the first and second output transmission lines being opposite to the end of the matrix comprising the RF-in terminal 305. Solutions with the RF-in terminal 305 and the RF-out terminals, 311 and 312, located at the same end of the matrix are also possible within the scope of the invention.

In one embodiment of the matrix balun, portions of the RF-in signal are successively tapped from the input transmission line $T_1$, 306, directly to the first output transmission line $T_{n-1}$, 330, via one amplifier $A_{1,c}$ or at least two amplifiers $A_{1,c}$ arranged in parallel in one row, thus making the total number of transmission lines equal to three, i.e. n=3.

In one embodiment of the matrix balun, portions of the RF-in signal are successively tapped from the first input transmission line $T_1$, 306, via one amplifier $A_{1,c}$ or at least two amplifiers $A_{1,c}$ arranged in parallel in one row, indirectly to the first output transmission line $T_{n-1}$, 330, via at least one additional transmission line, $T_2$-$T_{n-2}$, and at least one additional amplifier or at least one additional row of at least two amplifiers arranged in parallel. The additional transmission lines are thus inserted between the input transmission line $T_1$, 306, and the first output transmission line $T_{n-1}$, 330.

In one embodiment of the matrix balun, portions of the RF-in signal are successively tapped from the first input transmission line $T_1$, 306, via one amplifier $A_{1,c}$ or at least two amplifiers $A_{1,c}$ arranged in parallel in one row, directly to the transmission line $T_2$ and the amplified signal portions of the RF-in signal flowing in the transmission line $T_2$ are successively tapped from the transmission line $T_2$, 320, to an adjacent transmission line in the direction towards the first output transmission line via an additional amplifier or an additional row of amplifiers and then each further transmission line is tapped in the same way through a further additional amplifier or a further row of additional amplifiers until the amplified signal portions reaches the first output transmission line $T_{n-1}$, 330.

The amplifiers $A_{k,c}$ can be of any type as e.g a cascode cell of Field Effect Transistors (FET) as shown in FIG. 4a or a common source cell according to FIG. 4b or a bipolar transistor as shown in FIG. 4c. DC biasing is not shown in FIG. 4 for clarity reasons. FIG. 4a shows an amplifier $A_{k,c}$ comprising a cascode cell of two FET transistors, a first transistor 401 and a second transistor 402. An RF signal is connected to an input terminal 403 connected to a gate terminal 404 of the first transistor. The source terminal 405 of the first transistor is coupled to a ground 406. The bodies 407 and 408 of the first and second transistors are coupled to the ground 406. A drain terminal 409 of the first transistor is coupled to a source terminal 410 of the second transistor and a drain terminal 411 of the second transistor is coupled to an output terminal 412 via an optional line transmission section $TA_{k,c}$, 415. A gate terminal 413 of the second transistor is coupled to the ground 406 through a capacitor 414.

FIG. 4b shows an other embodiment of an amplifier $A_{k,c}$ comprising a FET transistor 420 in a common source configuration with a source terminal 421 connected to a ground 422. An RF-signal is connected to an input terminal 423 connected to a gate terminal 424 of the transistor. An output terminal 426 is connected to a drain terminal 425 of the transistor via an optional line transmission section $TA_{k,c}$, 428. A body 427 of the FET transistor 420 is connected to the ground 422.

FIG. 4c is yet another embodiment of an amplifier $A_{k,c}$ comprising a Bipolar Junction Transistor (BJT) 430 with an emitter terminal 431 connected to a ground 432. An RF-signal is connected to an input terminal 433 connected to a base terminal 434 of the transistor 430. An output terminal 435 is connected to a collector terminal 436 of the transistor via an optional line transmission section $TA_{k,c}$, 437.

The line transmission sections $TA_{k,c}$ can be used for adjusting and optimizing the total gain of the matrix balun and the phase difference between the RF-out terminals 311 and 312.

Figure 5:
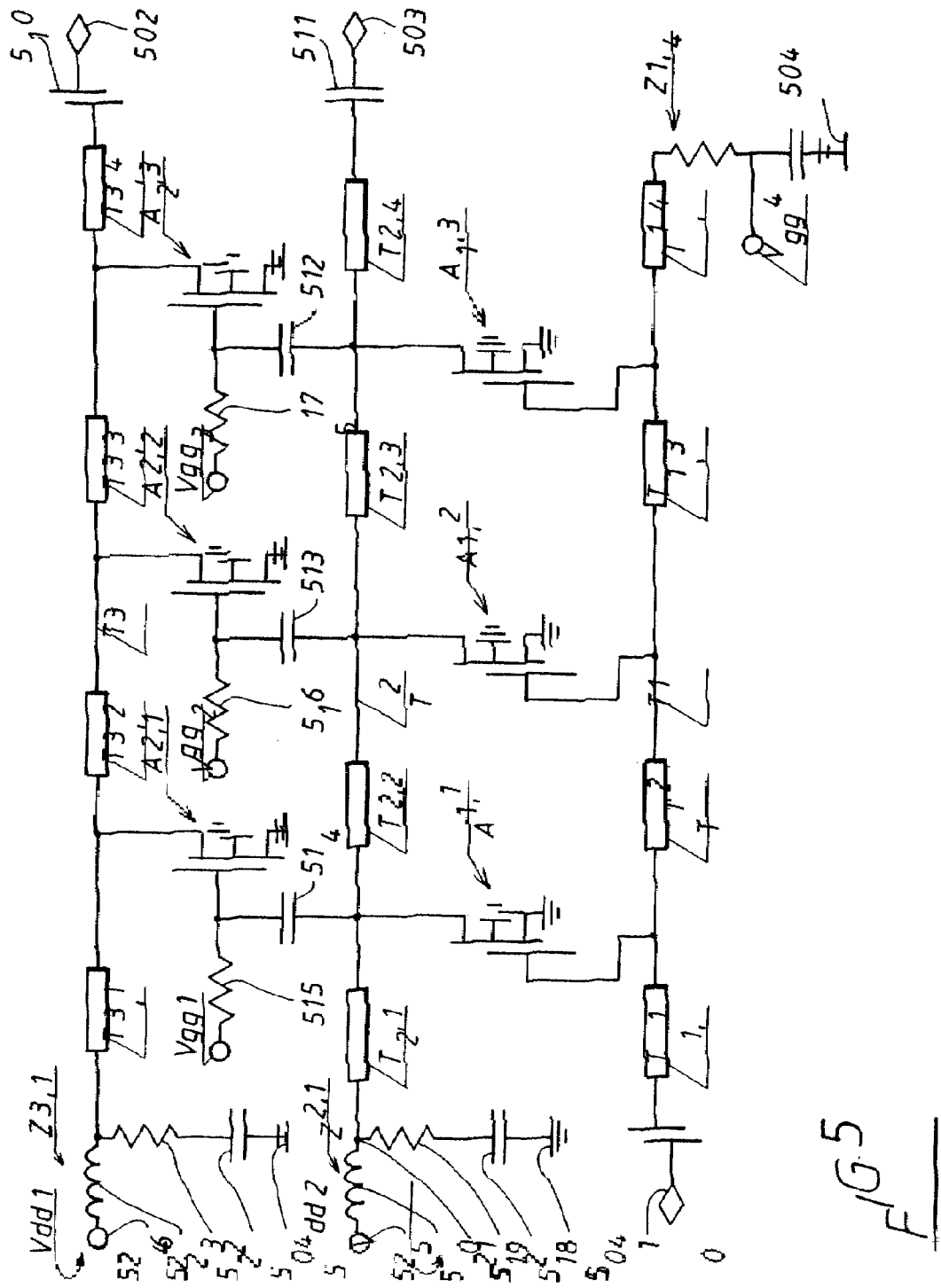
FIG. 5 Schematically shows one embodiment of DC-biasing of a matrix balun.

The amplifiers achieve both a gain and a 180° phase shift between RF-signals in transmission lines next to each other. This means that the phase difference between the RF-out terminals 311 and 312 will be 180°. The gain of each amplifier can be set individually but normally the gain is set at the same value for all amplifiers. The gain of an amplifier can e.g. be varied by changing DC-biasing for the transistor/transistors in the amplifier as illustrated in FIG. 5. The advantage with the inventive solution is that the amplitude level of an RF-out signal at each RF-out terminal will be at least the same as the amplitude level of the RF-in signal which is achieved by adjusting the gain level of the amplifiers. By increasing the gain or number of transmission lines the amplitude level of both the RF-out signals can be above the amplitude level of the RF-in signal. By using the principle of adding amplification to the RF-in signal from one row of amplifiers to the next row of amplifiers it will be possible to control amplitude and phase balance as well as the level of the RF-out signals with several parameters as e.g. the gain of the amplifiers $A_{k,c}$, the impedance of the open stubs and line transmission sections $T_{i,j}$ and line transmission sections $TA_{k,c}$ included in the amplifiers $A_{k,c}$. This means that the architecture of the matrix balun with amplification in at least two rows makes it possible to control the amplitude and phase balance over a broader bandwidth by using the broad range of control parameters available.

FIG. 5 shows an example of how DC-biasing can be realized in a matrix balun with three transmission lines $T_1$-$T_3$, three columns, an RF-in terminal 501, a first RF-out terminal 503, a second RF-out terminal 502 and a ground connection 504. The transmission line $T_1$ is an input transmission line, $T_2$ a first output transmission line and $T_3$ a second output transmission line. The amplifiers $A_{1,1}$-$A_{1,3}$ and $A_{2,1}$-$A_{2,3}$ are realized as transistors according to the amplifier embodiments shown in FIG. 4b. DC-blocking capacitors 510 and 511 are inserted before the RF-out terminals and DC-blocking capacitors 512-514 are also inserted between the drain terminals of the transistors in the first row and the gate terminals of the transistors in the second row of amplifiers. A DC-voltage Vgg1 is applied to the gate terminal of the amplifier $A_{2,1}$ through a resistor 515, a DC-voltage Vgg2 is applied to the gate terminal of the amplifier $A_{2,2}$ through a resistor 516 and a DC-voltage Vgg3 is applied to the gate terminal of the amplifier $A_{2,3}$ through a resistor 517. By choosing suitable values for the voltages Vgg1-Vgg3 and resistors 515-517 the gain of each amplifier can be individually set. By having the same values of Vgg1-Vgg3 and resistors 515-517 the gain of the amplifiers in the second row will be the same. This is the case for the amplifiers in the first row where the gate terminals of the amplifiers $A_{1,1}$-$A_{1,3}$ are fed by the same DC-voltage Vgg4 through a termination impedance $Z_{1,4}$ and line transmission sections. FIG. 5 also shows how a termination impedance $Z_{2,1}$ can be realized with a resistor 519, a capacitor 518 and an inductor 520. A first end of the resistor 519 is connected to a line transmission section $T_{2,1}$ at an end point 521 of the first output transmission line being opposite to the end with the first RF-out terminal 503. The second end of the resistor is connected to a first end of a DC-blocking capacitor 518 which at the second end is connected to the ground 504. A DC-voltage Vdd2, 525, is connected through the inductor 520 to the end point 521. The termination impedance can thus be a complex impedance having both inductive, capacitive and resistive elements. The values of the components can also be chosen such that the termination impedance $Z_{2,1}$ e.g. becomes purely resistive. The DC-voltage Vdd2 can be chosen such as to optimize the total gain of the matrix balun. Termination impedance $Z_{3,1}$ is realized in the same way with a resistor 523, a capacitor 522 and an inductor 524. A DC-voltage Vdd1, 526, is applied to the transmission line $T_3$ through the inductor 524. Vdd1 can also be used to optimize the total gain of the matrix balun. The DC-voltages applied to the transmission lines can also be the same for each transmission line i.e. Vdd1=Vdd2.

The matrix balun described in association with FIG. 3a is using the principle of a Distributed Amplifier, DA. The DA consists of a pair of transmission lines which are periodically loaded with active devices, e.g. FETs or BJTs. The time delays of the two lines are then made equal by proper choice of line lengths, impedances and sizes of the active devices. An RF signal is supplied to the input of the first line, commonly called the gate line, and as it propagates down the line, portions of the signal are drained and fed through the active devices, where they are amplified, to the second line, commonly called the drain line, where they are added together and propagate towards the output.

An advantage with the invention is that by using the principle of the Distributed Amplifier which inherently is very broad banded and with amplifiers in at least two rows, a bandwidth of at least one decade is possible. A typical embodiment can have a bandwidth of e.g. 3-40 GHz, but also broader bandwidths are possible.

The gain level is also affected by the impedance of the line transmission sections $T_{i,j}$. The total gain of the balun can thus be tuned by adjusting the gain of the amplifiers and the impedances of the line transmission sections. The gain of the amplifiers is also adjusted so as to receive an amplitude balance between the two RF-out signals.

The impedance of the amplifiers and open stubs are mainly capacitive and the impedance of the line transmission sections is mainly inductive. As mentioned above the impedance of the line transmission sections can be varied by giving the line transmission sections $T_{i,j}$ different lengths and widths. The RF-input impedance of the balun, i.e. the impedance between the RF-in terminal and ground, seen from the input end, or the gate end g, is proportional to $$\sqrt{\frac{L_g}{C_g}}$$

where $L_g$ is the total inductance of the balun from the input end, mainly comprising the inductances of the line transmission sections, and where $C_g$ is the total capacitance of the balun from the input end, mainly comprising the capacitances of the amplifiers and the open stubs. The RF-output impedance, i.e. the impedance between the RF-out terminals seen from the output end, or the drain end d, is proportional to $$\sqrt{\frac{L_d}{C_d}}$$

where $L_d$ is the total inductance of the balun from the output end, mainly comprising the inductances of the line transmission sections, and where $C_d$ is the total capacitance of the balun from the output end, mainly comprising the capacitances of the amplifiers and the open stubs. The balun has a 1:1 impedance transformation when $$\sqrt{\frac{L_g}{C_g}} = \sqrt{\frac{L_d}{C_d}}.$$

The input and output impedance can thus be tuned by giving the parameters $L_g$, $L_d$, $C_g$ and $C_d$ different values e.g. by giving the different line transmission sections $T_{i,j}$ different impedance values by e.g. varying the widths of the line transmission sections. In one embodiment all the $T_{i,j}$ can have the same impedance, in an other embodiment some $T_{i,j}$ can have the same value and in further embodiments all the $T_{i,j}$ have different values. This possibility to adjust the impedance of the balun is a further advantage of the invention. The input and output impedance of the matrix balun can also be adjusted by changing the characteristics of $A_{c,k}$ and $O_{n,m}$. The characteristics of $A_{c,k}$ can e.g. be the gain of the amplifier and impedance of the $TA_{k,c}$.

One or several line transmission sections $T_{i,j}$ located at either end of a transmission line i can optionally comprise merely of the impedance caused by connection of an output or input connector to either end of the transmission line i.

An important feature of a balun is that the balanced signals have a phase difference of 180°. This is achieved by the amplifiers shifting the phase 180° from one transmission line to the next. The phase difference is constant over a wide bandwidth because all the amplifiers have almost equal phase response over the bandwidth and can be fine tuned e.g. by varying the impedances of the line transmission sections which can be accomplished by adjusting the length and width of the line transmission sections $T_{i,j}$, thus keeping the phase difference at substantially 180°.

The amplitude level of the two RF-out terminals must be in balance over the bandwidth. This is achieved by using the distributed amplification principle, described above, which gives a substantially constant gain over a bandwidth as big as at least one decade. By choosing suitable parameter values for the line transmission section $T_{i,j}$, as for instance length and width, and gain values for the amplifiers and by having this constant gain, as a function of frequency, between the transmission lines it will be possible to achieve amplitude balanced signals having a mutual phase difference of 180° at the RF-out terminals. The gain for the row of amplifiers adjacent the second output transmission line can be chosen such that it will compensate for the losses in the transmission line sections. By having two or more rows of amplifiers it will also be possible to add a gain to the amplitude level of each RF-out signal compared to the amplitude level of the RF-in signal. In one embodiment the gain of each amplifier is the same, in another embodiment the gain can be equal for a number of amplifiers e.g. each amplifier in one row has the same gain value. In a further embodiment the gain can be different in each amplifier as explained in FIG. 5.

The termination impedance $Z_{i,j}$ is chosen such as that it is matched with the impedance of the transmission line, by principles well known to the skilled person.

A further advantage with the invention is that by using e.g. PHEMT (Pseudomorphic High Electron Mobility Transistor) or CMOS (Complementary Metal Oxide Semiconductor) technology for producing the chip including FET transistors and line transmission sections it is possible to achieve very compact and power efficient solutions. Bipolar Junction Transistors (BJTs) can also be used. A typical size for a balun covering a frequency band from 3-40 GHz can be approximately 1 mm².

The invention is not limited to the embodiments described above, but may vary freely within the scope of the appended claims.

The invention claimed is:

1. A matrix balun having m columns and n transmission lines in a matrix comprising an input transmission line $T_1$ with an RF-in terminal for receiving a single-ended RF-in signal, the RF-in terminal being connected to one end of the input transmission line $T_1$, and a first output transmission line $T_{n-1}$, with a first RF-out terminal being connected to one end of the first output transmission line $T_{n-1}$, the input transmission line $T_1$ having portions of the RF-in signal successively tapped to the first output transmission line $T_{n-1}$ via one amplifier $A_{1,c}$ or at least two amplifiers $A_{1,c}$ arranged in parallel in one row, the amplifiers having an input terminal connected to the input transmission line $T_1$ and having a certain gain, wherein the input transmission line $T_1$ is directly or indirectly coupled to the first output transmission line $T_{n-1}$ and wherein the matrix balun comprises a second output transmission line $T_n$ adjacent the first output transmission line $T_{n-1}$, the second output transmission line $T_n$ having a second RF-out terminal connected to one end of the second output transmission line $T_n$, making a total of n transmission lines, $T_1$ to $T_n$ arranged in consecutive order after increasing value of n, and wherein the amplified portions of the RF-in signal flowing in the first output transmission line $T_{n-1}$ are successively tapped from the first output transmission line $T_{n-1}$ directly to the second output transmission line $T_n$ via one additional amplifier or at least two additional amplifiers arranged in parallel in a row, thus obtaining two balanced RF-out signals at the first and at the second RF-out terminal, where each RF-out signal has an amplitude level equal to or exceeding the amplitude level of the RF-in signal and where the RF-out signals have a mutual phase difference of 180° and are of equal amplitude levels.

2. The matrix balun according to claim 1, wherein in that the portions of the RF-in signal are successively tapped from the input transmission line $T_1$ directly to the first output transmission line $T_{n-1}$ via one amplifier $A_{1,c}$ or at least two amplifiers $A_{1,c}$ arranged in parallel in one row, thus making the total number of transmission lines equal to three, i.e. n=3.

3. The matrix balun according to claim 1, wherein the portions of the RF-in signal are successively tapped from the first input transmission line $T_1$, via one amplifier $A_{1,c}$ or at least two amplifiers $A_{1,c}$ arranged in parallel in one row, indirectly to the first output transmission line $T_{n-1}$ via at least one additional transmission line, $T_2$-$T_{n-2}$, and at least one additional amplifier or at least one additional row of at least two amplifiers arranged in parallel.

4. The matrix balun according to claim 3, wherein the portions of the RF-in signal are successively tapped from the first input transmission line $T_1$, via one amplifier $A_{1,c}$ or at least two amplifiers $A_{1,c}$ arranged in parallel in one row, directly to the transmission line $T_2$ and in that the amplified signal portions of the RF-in signal flowing in the transmission line $T_2$ are successively tapped from the transmission line $T_2$ to an adjacent transmission line in the direction towards the first output transmission line via an additional amplifier or an additional row of amplifiers and then each further transmission line is tapped in the same way through a further additional amplifier or a further row of additional amplifiers until the amplified signal portions reaches the first output transmission line $T_{n-1}$.

5. The matrix balun according to claim 1, wherein the transmission lines are extending between a first end of the matrix and a second end of the matrix and the columns are extending between a bottom end of the matrix and a top end of the matrix.

6. The matrix balun according to claim 5, wherein the input transmission line $T_1$ is located at the bottom end of the matrix, the second output transmission line $T_n$ at the top end of the matrix and the RF-in terminal at the first end of the matrix.

7. The matrix balun according to claim 5, wherein the first RF-out terminal is located at the end of the first output transmission line $T_{n-1}$ being at the second end of the matrix being opposite to the first end of the matrix and the second RF-out terminal is located at the end of the second output transmission line $T_n$ being at the second end of the matrix.

8. The matrix balun according to claim 1, wherein each transmission line has m+1 line transmission sections $T_{i,j}$ coupled in series, each line transmission section $T_{i,j}$ having an input end at the end towards the RF-in terminal and an output end at the opposite end, wherein the output end of each line transmission section in a transmission line, except for the output ends from line transmission sections at the last line transmission section in each transmission line and the output ends from the line transmission sections located in the second output transmission line $T_n$, being coupled to input terminals of m amplifiers $A_{k,c}$, the output terminals of which are successively coupled to the output ends of m line transmission sections coupled in series and included in the next transmission line in the matrix in the direction towards the second output transmission line $T_n$, wherein all ends of the transmission lines, except the three ends connected to the RF-out terminals and the RF-in terminal are connected to a termination impedance $Z_{u,v}$, wherein each column c consists of corresponding line transmission sections for each transmission line, i.e. line transmission sections $T_{i,j}$ with j=c ($T_{1,c}$, $T_{2,c}$ ... $T_{n,c}$) and amplifiers $A_{k,c}$ having the same c number, and wherein one open stub $O_{n,1}$ to $O_{n,m}$ is connected between each pair of line transmission sections $T_{n,1}/T_{n,2}$ to $T_{n,m}/T_{n,m+1}$ in the second output transmission line.

9. The matrix balun according to claim 8, wherein the line transmission section $T_{i,j}$ is located in transmission line i where index i can have values from 1 to n, and where index j can have values from 1 to m+1 and wherein the index j also represents the column to which the line transmission section belongs with the exception that the line transmission section $T_{i,m+1}$ of each transmission line, does not belong to a certain column.

10. The matrix balun according to claim 8, wherein the impedance of each line transmission section $T_{i,j}$ can be varied by adapting the length and width of the line transmission section.

11. The matrix balun according to claim 8, wherein one or several line transmission sections $T_{i,j}$ located at either end of a transmission line i comprises of the impedance caused by connection of an output or input connector to either end of the transmission line i.

12. The matrix balun according to claim 1, wherein the matrix has m columns with column 1 located towards the end of the matrix including the RF-in terminal and column m at the opposite end of the matrix.

13. The matrix balun according to claim 1, wherein the matrix balun comprises the amplifiers $A_{k,c}$ arranged in parallel in n−1 rows and m columns and each amplifier having one input terminal and one output terminal, where k denotes the number of the row and transmission line to which the input terminal of the amplifier is connected, with row 1 adjacent to the input transmission line $T_1$ and where c denotes the number of the column where the amplifier is located.

14. The matrix balun according to claim 1, wherein the amplifier $A_{k,c}$ comprises a cascade cell of Field Effect Transistors or a Field Effect Transistors transistor in common source configuration or a Bipolar Junction Transistor.

15. The matrix balun according to claim 1, wherein the amplifiers $A_{k,c}$ in the same row has a same gain.

16. The matrix balun according to claim 1, wherein each amplifier $A_{k,c}$ has an individually set gain.

17. The matrix balun according to claim 1, wherein the termination impedance $Z_{u,v}$ is connected to each end of a transmission line not connected to the RF-in terminal or the RF-out terminals, where u can have values from 1 to n and where u also denotes the number of the transmission line to which $Z_{u,v}$ is connected and wherein the second index v can assume either value 1 denoting that $Z_{u,v}$ is terminating a transmission line at the end of the matrix including the RF-in terminal or value m+1, denoting that $Z_{u,v}$ is terminating a transmission line at the opposite end of the matrix.

18. The matrix balun according to claim 1, wherein the amplifier $A_{k,c}$ comprises a line transmission section $TA_{k,c}$ between a drain terminal and an output terminal or between a collector terminal and an output terminal arranged for adjusting and optimizing the total gain of the matrix balun and the phase difference between the RF-out terminals.

19. The matrix balun according to claim 1, wherein one open stub $O_{n-1,1}$ to $O_{n-1,m}$ is connected between each pair of line transmission sections $T_{n-1,1}/T_{n-1,2}$ to $T_{n-1,m}/T_{n-1,m+1}$ in the first output transmission line.

20. A method for adjusting a matrix balun, the method comprising:

balancing amplitude levels of two RF-out signals by varying gain of amplifiers $A_{k,c}$, impedance of open stubs $O_{n,1}$ to $O_{n,m}$ and $O_{n-1,1}$ to $O_{n-1,m}$, the impedances of line transmission sections $T_{i,j}$ and line transmission sections $TA_{k,c}$ included in amplifiers $A_{k,c}$ and further by adjusting the phase difference between the two RF-out signals by varying the impedances of the line transmission sections $T_{i,j}$ and the line transmission sections $TA_{k,c}$ included in the amplifiers $A_{k,c}$ and the impedance of open stubs $O_{n,1}$ to $O_{n,m}$ and $O_{n-1,1}$ to $O_{n-1,m}$ to keep the difference at substantially 180°.

21. The method according to claim 20, wherein the gain of the matrix balun is optimized by applying individual DC-voltages to ends of certain transmission lines.

22. The method according to claim 20, wherein an RF-output impedance, being the impedance between the RF-out terminals is proportional to $$\sqrt{\frac{L_d}{C_d}}$$

where $L_d$ total inductance of the balun from the output end, mainly comprising the inductances of the line transmission sections $T_{i,j}$, and where $C_d$ is the total capacitance of the balun from the output end, mainly comprising the capacitances of the amplifiers and the open stubs, the RF-output impedance being adjustable by changing the values of $L_d$ and $C_d$.

* * * * *